(12) United States Patent
Blood et al.

(10) Patent No.: US 12,130,322 B2
(45) Date of Patent: Oct. 29, 2024

(54) TRAVELING WAVE ANALYSIS AND FAULT LOCATING FOR ELECTRIC POWER SYSTEMS

(71) Applicant: Schweitzer Engineering Laboratories, Inc., Pullman, WA (US)

(72) Inventors: Ellery A. Blood, West Lafayette, IN (US); Gregory R. Smelich, Butte, MT (US); Riley Grant Huddleston, Moscow, ID (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 0 days.

(21) Appl. No.: 18/061,118

(22) Filed: Dec. 2, 2022

(65) Prior Publication Data

US 2024/0183893 A1     Jun. 6, 2024

(51) Int. Cl.
    *G01R 31/08*      (2020.01)
(52) U.S. Cl.
    CPC ......... *G01R 31/088* (2013.01); *G01R 31/085* (2013.01); *G01R 31/086* (2013.01)
(58) Field of Classification Search
    CPC .................................................. G01R 31/088
    See application file for complete search history.

(56) References Cited

U.S. PATENT DOCUMENTS

| | | | |
|---|---|---|---|
| 3,585,298 A | 6/1971 | Liberman | |
| 3,670,240 A | 6/1972 | Maranchak | |
| 3,878,460 A | 4/1975 | Nimmersjö | |
| 3,890,544 A | 6/1975 | Chamia | |
| 3,956,671 A | 5/1976 | Nimmersjö | |
| 4,053,816 A | 10/1977 | Nimmersjö | |
| 4,254,444 A | 3/1981 | Eriksson | |
| 4,296,452 A | 10/1981 | Eriksson | |
| 4,344,142 A | 8/1982 | Diehr | |
| 4,351,011 A | 9/1982 | Liberman | |
| 4,377,834 A | 3/1983 | Eriksson | |

(Continued)

FOREIGN PATENT DOCUMENTS

| | | |
|---|---|---|
| EP | 226210 | 12/1986 |
| EP | 241832 | 7/1990 |

(Continued)

OTHER PUBLICATIONS

Edmund O. Schweitzer III, Armando Guzman, Mangapathirao V. Mynam, Veselin Skenzic, Bogdan Kasztenny: "Locating Faults by the Traveling Waves they Launch" 40th Annual Western Protective Relay Conference, Oct. 2013.

(Continued)

*Primary Examiner* — Farhana A Hoque
*Assistant Examiner* — Joseph O Nyamogo
(74) *Attorney, Agent, or Firm* — Jared L. Cherry

(57) ABSTRACT

Systems may include a first data acquisition subsystem, a second data acquisition subsystem, and a traveling wave analysis subsystem. The traveling wave analysis subsystem may be configured to analyze measured traveling wave data from the first data acquisition subsystem and the second data acquisition subsystem. Additionally, methods of analyzing traveling wave data resulting from a fault on an electric power delivery system may involve analyzing measured electrical properties of at least one traveling wave.

18 Claims, 11 Drawing Sheets

(56) References Cited

U.S. PATENT DOCUMENTS

| | | |
|---|---|---|
| 4,499,417 A | 2/1985 | Wright |
| 4,626,772 A | 12/1986 | Michel |
| 4,766,549 A | 8/1988 | Schweitzer |
| 4,797,805 A | 1/1989 | Nimmersjö |
| 4,800,509 A | 1/1989 | Nimmersjö |
| 5,198,746 A | 3/1993 | Gyugyi |
| 5,272,439 A | 12/1993 | Mashikian |
| 5,446,387 A | 8/1995 | Eriksson |
| 5,572,138 A | 11/1996 | Nimmersjö |
| 5,600,248 A | 2/1997 | Westrom |
| 5,682,100 A | 10/1997 | Rossi |
| 5,729,144 A | 3/1998 | Cummins |
| 6,161,077 A | 12/2000 | Fawcett |
| 6,341,055 B1 | 1/2002 | Guzman-Casillas |
| 6,417,791 B1 | 7/2002 | Benmouyal |
| 6,477,475 B1 | 11/2002 | Takaoka |
| 6,597,180 B1 | 7/2003 | Takaoka |
| 6,798,211 B1 | 9/2004 | Rockwell |
| 7,174,261 B2 | 2/2007 | Gunn |
| 7,535,233 B2 | 5/2009 | Kojovic |
| 7,714,735 B2 | 5/2010 | Rockwell |
| 7,733,094 B2 | 6/2010 | Bright |
| 8,315,827 B2 | 11/2012 | Faybisovich |
| 8,525,522 B2 | 9/2013 | Gong |
| 8,598,887 B2 | 12/2013 | Bjorklund |
| 8,655,609 B2 | 2/2014 | Schweitzer |
| 8,781,766 B2 | 7/2014 | Schweitzer |
| 8,874,391 B2 | 10/2014 | Taylor |
| 8,990,036 B1 | 3/2015 | Schweitzer |
| 9,470,748 B2 | 10/2016 | Schweitzer |
| 9,594,112 B2 | 3/2017 | Schweitzer |
| 9,627,881 B2 | 4/2017 | Schweitzer |
| 10,090,664 B2 | 10/2018 | Schweitzer |
| 10,295,585 B2 | 5/2019 | Schweitzer |
| 10,302,690 B2 | 5/2019 | Schweitzer |
| 10,310,004 B2 | 6/2019 | Schweitzer |
| 10,310,005 B2 | 6/2019 | Schweitzer |
| 10,585,133 B2 | 3/2020 | Guzman-Casillas |
| 10,989,752 B2 | 4/2021 | Schweitzer |
| 2001/0012984 A1 | 8/2001 | Adamiak |
| 2002/0118021 A1 | 8/2002 | Saha |
| 2002/0130668 A1 | 9/2002 | Blades |
| 2002/0165462 A1 | 11/2002 | Westbrook |
| 2002/0169585 A1 | 11/2002 | Jones |
| 2004/0189317 A1 | 9/2004 | Borchert |
| 2004/0230387 A1 | 11/2004 | Bechhoefer |
| 2005/0057227 A1 | 3/2005 | Rockwell |
| 2005/0151659 A1 | 7/2005 | Donovan |
| 2006/0012374 A1 | 1/2006 | Kojovic |
| 2007/0124093 A1 | 5/2007 | Choi |
| 2008/0077336 A1 | 3/2008 | Fernandes |
| 2009/0230974 A1 | 9/2009 | Kojovic |
| 2011/0058285 A1 | 3/2011 | Wibben |
| 2011/0173496 A1 | 7/2011 | Hosek |
| 2011/0227581 A1 | 9/2011 | Kojovic |
| 2011/0264388 A1 | 10/2011 | Gong |
| 2012/0086459 A1 | 4/2012 | Kim |
| 2012/0256637 A1 | 10/2012 | Juhlin |
| 2013/0021039 A1 | 1/2013 | Bjorklund |
| 2013/0096854 A1 | 4/2013 | Schweitzer |
| 2013/0100564 A1 | 4/2013 | Zhang |
| 2013/0116944 A1 | 5/2013 | Seibel |
| 2013/0241622 A1 | 9/2013 | Zerbe |
| 2014/0074414 A1 | 3/2014 | Schweitzer, III |
| 2015/0081236 A1 | 3/2015 | Schweitzer |
| 2016/0077149 A1 | 3/2016 | Schweitzer |
| 2016/0077150 A1 | 3/2016 | Schweitzer |
| 2016/0084893 A1 | 3/2016 | Schweitzer |
| 2016/0266192 A1* | 9/2016 | Burek ............... G01R 31/088 |
| 2017/0012424 A1 | 1/2017 | Schweitzer |
| 2017/0082675 A1 | 3/2017 | Schweitzer |
| 2017/0104324 A1 | 4/2017 | Schweitzer |
| 2017/0146613 A1 | 5/2017 | Schweitzer |
| 2017/0276718 A1* | 9/2017 | Dzienis ............... H03H 7/0138 |
| 2018/0136269 A1* | 5/2018 | Schweitzer, III ...... G01R 31/11 |
| 2018/0292448 A1 | 10/2018 | Schweitzer |
| 2019/0187202 A1* | 6/2019 | Schweitzer, III .... G01R 31/085 |
| 2019/0212382 A1* | 7/2019 | Guzman-Casillas ....... G01R 31/085 |
| 2019/0391191 A1* | 12/2019 | Obbalareddi Demudu ............ H02H 7/265 |

FOREIGN PATENT DOCUMENTS

| | | |
|---|---|---|
| EP | 164711 | 12/1991 |
| EP | 244649 | 4/1992 |
| EP | 627085 | 12/2005 |
| GB | 1463755 | 2/1977 |
| WO | 9519060 | 7/1995 |
| WO | 2007135073 | 11/2007 |
| WO | 2010099585 | 9/2010 |
| WO | 2013119315 | 8/2013 |

OTHER PUBLICATIONS

Armando Guzman, Bogdan Kasztenny, Yajian Tong, Mangapathirao V. Mynam: "Accurate and Economical Traveling-Wave Fault Locating Without Communications" 44th Anula Western Protective Relay Conference, Oct. 2017.

Bogdan Kasztenny, Venkat Mynam: "Line Length and Fault Distance Considerations in Traveling-Wave Protection and Fault-Locating Applications" May 2021.

David Lopez Corton, Jorge Vaquero Melado, Jesus Cruz, Richard Kirby, Yusuf Zafer Korkma, Gianfranco Patti, Greg Smelich: "Double-Ended Traveling-Wave Fault Locating Without Relay-to-Relay Communications" 74th Annual Confeence for Potective Relay Engineers, Mar. 2021.

* cited by examiner

US 12,130,322 B2

TRAVELING WAVE ANALYSIS AND FAULT LOCATING FOR ELECTRIC POWER SYSTEMS

TECHNICAL FIELD

This disclosure relates to systems, devices, and methods for utilizing traveling wave analysis for determining fault locations in electric power systems. More particularly, but not exclusively, this disclosure relates to analyzing one or more traveling wave forms with Bewley lattice diagrams for determining fault locations.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Figure 1:
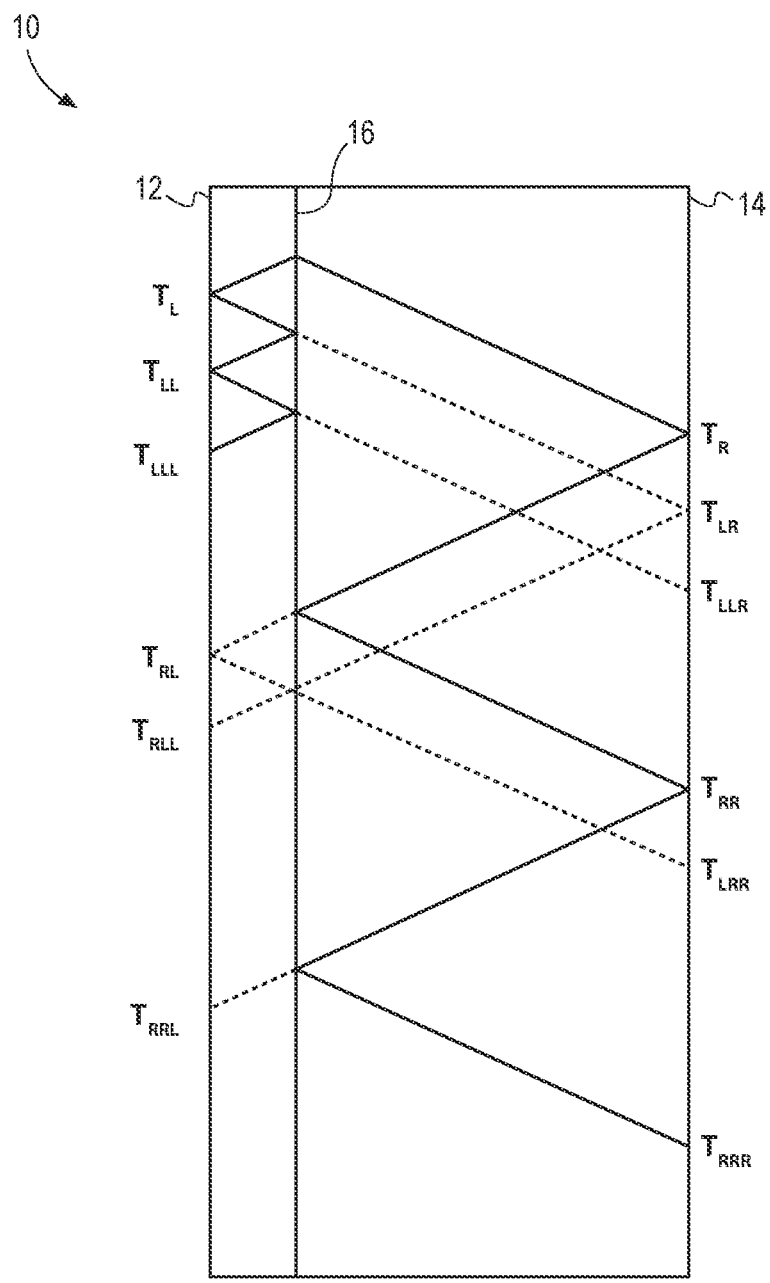
FIG. 1 illustrates a traveling wave Bewley lattice diagram consistent with embodiments of the present disclosure.

Traveling waves (TWs) are surges of electricity resulting from sudden changes in voltage that propagate at nearly the speed of light on overhead power transmission lines and at approximately half the speed of light on underground cables. When launched by a line fault, the step change in voltage launches current and voltage TWs that initiate at the fault and travel towards each end of the line. As they travel along the line, coupling may occur between the three phases of the power system, with a relationship that is dependent on the fault type. These TWs may arrive at line terminals within a short span of time (e.g., a few milliseconds depending on the line length and fault location). When the initial TWs arrive at a line terminal, some of the energy is reflected back towards the fault as a reflected TW. When the reflected TW arrives at the fault, some of the energy continues in the same direction and some of the energy is reflected again and returns to the line terminal. Relative arrival times, polarities, and magnitudes of TWs may allow for identifying the fault type and locating the fault with accuracy on the order of a single tower span.

Embodiments consistent of the present disclosure provide significant flexibility in analyzing TWs by allowing an operator to adjust a plurality of parameters to match electric parameters associated with a TW. For example, multiple TW arrival times resulting from reflections may be fixed to provide additional control over the solution space. In some embodiments, the TW may be represented by a system of linear equations (e.g., one each per TW arrival time) that include variables that represent a variety of parameters (e.g., fault location, line length, impedances, resistances, fault resistances, propagation times, propagation velocities, capacitances, inductances, reactances, lengths, and/or the like) may be solved.

The embodiments of the disclosure will be best understood by reference to the drawings. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor do the steps need to be executed only once, unless otherwise specified.

In some cases, well-known features, structures, or operations are not shown or described in detail. Furthermore, the described features, structures, or operations may be combined in any suitable manner in one or more embodiments. It will also be readily understood that the components of the embodiments, as generally described and illustrated in the figures herein, could be arranged and designed in a wide variety of different configurations. For example, throughout this specification, any reference to "one embodiment," "an embodiment," or "the embodiment" means that a particular feature, structure, or characteristic described in connection with that embodiment is included in at least one embodiment. Thus, the quoted phrases, or variations thereof, as recited throughout this specification are not necessarily all referring to the same embodiment.

Several aspects of the embodiments disclosed herein may be implemented as software modules or components. As used herein, a software module or component may include any type of computer instruction or computer-executable code located within a memory device that is operable in conjunction with appropriate hardware to implement the programmed instructions. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a non-transitory machine-readable medium having stored thereon instructions that may be used to program a computer or other electronic device to perform processes described herein. The non-transitory machine-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of media/machine-readable media suitable for storing electronic instructions. In some embodiments, the computer or another electronic device may include a processing device such as a microprocessor, microcontroller, logic circuitry, or the like. The processing device may further include one or more special purpose processing devices such as an application specific interface circuit (ASIC), PAL, PLA, PLD, field programmable gate array (FPGA), or any other customizable or programmable device.

An event, such as a fault, that initiates TWs may occur at a specific time, which is referred to as "$T_0$" herein. When an event occurs mid-line (e.g., distant from a terminal where measurements may be taken), $T_0$ is not directly measurable.

When a power line is energized by closing a circuit breaker at one end, TWs are initiated that are observed nearly immediately at the terminal where the circuit breaker was closed and observed at the other line terminal after the TWs propagate along the entire length of the line. The time from the initiation of a TW at one terminal and the TW arrival at the other terminal is the TW line propagation time, T, which may be calculated by using Eq. 1, $$T = \left(\frac{LL}{v*c}\right)(1 + eps) \quad \text{Eq. 1}$$

wherein LL represents the line length, v represents the propagation velocity as a fraction of the speed of light (c), and eps is a dispersion factor. The LL may be difficult to precisely determine due to line sag and the topography of the area, but the LL may be estimated to a sufficient degree of accuracy. Additionally, the LL may change due to environmental conditions. For example, the line sag may increase in relatively high temperatures. Likewise, the propagation velocity depends on the inductance and capacitance of the line; therefore, it may be affected by environmental conditions, such as humidity, temperature, air pressure, etc.

Faults that occur on the line are located a distance m (expressed as a per-unitized fraction of line length) from the local terminal and a distance 1−m from the remote terminal where measurements may be taken. The per-unitized fault location, m, may be converted to a linear distance by multiplying it by the line length (LL) or converted to a time by multiplying by the TW line propagation time (T). The propagation time from the fault to the local and remote terminals may be determined using Eqs. 2 and 3, respectively.

Propagation Time to Local Terminal=$m*T$ Eq. 2

Propagation Time to Remote Terminal=$(1-m)*T$ Eq. 3

For a fault initiated at time $T_0$, the initial TW will arrive at the local terminal at a time determined using Eq. 4 and will arrive at the remote terminal at a time determined using Eq. 5.

Local Terminal Arrival Time=$T_0+mT$ Eq. 4

Remote Terminal Arrival Time=$T_0+(1-m)T$ Eq. 5

Additionally, it may take further time for the TW to travel down current transformer (CT) or potential transformer (PT) cables to the device taking measurements. CTs and PTs are collectively known as instrument transformers. The delay associated with the instrument transformer cables at the local terminal, $d_L$, and remote terminal, $d_R$, may be included in the arrival times at the recording device using Eqs. 6 and 7.

Local Terminal Arrival Time=$T_0+mT+d_L$ Eq. 6

Remote Terminal Arrival Time=$T_0+(1-m)T+d_R$ Eq. 7

The difference in the arrival times for the initial TW at the local terminal versus the remote terminal may be used to estimate the fault location. Accordingly, both TW arrival times may be shifted by $d_L$ such that the TW arrival times are determined using Eq. 4 for the local terminal and Eq. 8 for the remote terminal.

Remote Terminal Arrival Time=$T_0+(1-m)T+(d_R-d_L)$ Eq. 8

The impact of the instrument transformer cable delay on the fault location estimation is therefore dependent on the difference between $d_L$ and $d_R$, $d=d_R-d_L$. A TW system may further account for a time skew parameter. In some embodiments, a time skew may represent a difference between clock synchronization at the remote terminal and the local terminal. Further, the skew may account for differences in TW shape or different group delays for instrument transformers that may impact time of arrival determinations. Therefore, the instrument transformer cable delay, d, may be modified to include the time skew, $d_{Skew}$, and may be determined using Eq. 9.

$d=(d_R-d_L)+d_{Skew}$ Eq. 9

FIG. 1 illustrates a TW Bewley lattice diagram 10 for correlating TW arrival times with actual TW paths through time on a transmission line and consistent with embodiments of the present disclosure. The subscript L and R correspond to local and remote respectively but could also be interpreted as left and right as the local terminal is shown on the left side 12 and remote terminal on the right side 14 in FIG. 1.

When the TWs are launched, the propagation time to the local terminal may be determined using Eq. 2, and the propagation time to the remote terminal may be determined using Eq. 3. The first right TW arrival time is labeled $T_R$. Subsequent TW arrival times are labeled based on the terminals from which it reflected last. Therefore, the TW arrival time that is a reflection from $T_L$ to a fault location 16 and back to the left side 12 is $T_{LL}$. A TW arrival that reflects from $T_L$ then passes through the fault location 16 to arrive at the right side 14 is labeled $T_{LR}$.

Two full traversals are illustrated for reflections between the local terminal 12 and the fault location 16. Each of the TW arrival times can be represented in terms of $T_0$, mT, T, and d. Eq. 10 shows a matrix representation for the reflection at $T_L$, and Eq. 11 represents the reflection at $T_R$.

$$[T_L] = [1 \ 1 \ 0 \ 0] \begin{bmatrix} T_0 \\ mT \\ T \\ d \end{bmatrix} \quad \text{Eq. 10}$$

$$[T_R] = [1 \ -1 \ 1 \ 1] \begin{bmatrix} T_0 \\ mT \\ T \\ d \end{bmatrix} \quad \text{Eq. 11}$$

Eq. 12 shows additional reflections.

$$\begin{bmatrix} T_L \\ T_{LL} \\ T_{LR} \\ T_R \\ T_{RR} \\ T_{RL} \\ T_{LLL} \\ T_{RLL} \\ T_{LRL} \\ T_{RRL} \\ T_{LRR} \\ T_{LLR} \\ T_{RLR} \\ T_{RRR} \end{bmatrix} = \begin{bmatrix} 1 & 1 & 0 & 0 \\ 1 & 3 & 0 & 0 \\ 1 & 1 & 1 & 1 \\ 1 & -1 & 1 & 1 \\ 1 & -3 & 3 & 1 \\ 1 & -1 & 2 & 0 \\ 1 & 5 & 0 & 0 \\ 1 & 1 & 2 & 0 \\ 1 & 1 & 2 & 0 \\ 1 & -3 & 4 & 0 \\ 1 & -1 & 3 & 1 \\ 1 & 3 & 1 & 1 \\ 1 & -1 & 3 & 1 \\ 1 & -5 & 5 & 1 \end{bmatrix} \begin{bmatrix} T_0 \\ mT \\ T \\ d \end{bmatrix} \quad \text{Eq. 12}$$

The form of the reflections may be generalized as shown in Eq. 13.

$$[T_x] = [A] \begin{bmatrix} T_0 \\ mT \\ T \\ d \end{bmatrix} \quad \text{Eq. 13}$$

The parameters other than $T_0$ may be measured by a TW detection system and used to determine $T_0$ using Eqs. 14-16.

$$[T_L] = [1 \ 1 \ 0 \ 0] \begin{bmatrix} T_0 \\ mT \\ T \\ d \end{bmatrix} \quad \text{Eq. 14}$$

$$[T_L] = T_0 + [1 \ 0 \ 0] \begin{bmatrix} mT \\ T \\ d \end{bmatrix} \quad \text{Eq. 15}$$

$$T_0 = [T_L] - [1 \ 0 \ 0] \begin{bmatrix} mT \\ T \\ d \end{bmatrix} \quad \text{Eq. 16}$$

Using this representation, any combination of the four parameters (i.e., $T_0$, mT, T, and d) may be calculated if the [A] matrix has sufficient rank. A full rank square matrix can be inverted allowing the parameter vector to be solved for. One check to verify a square matrix is full rank is to take the matrix determinant and verify it is not equal to zero.

Figure 2:
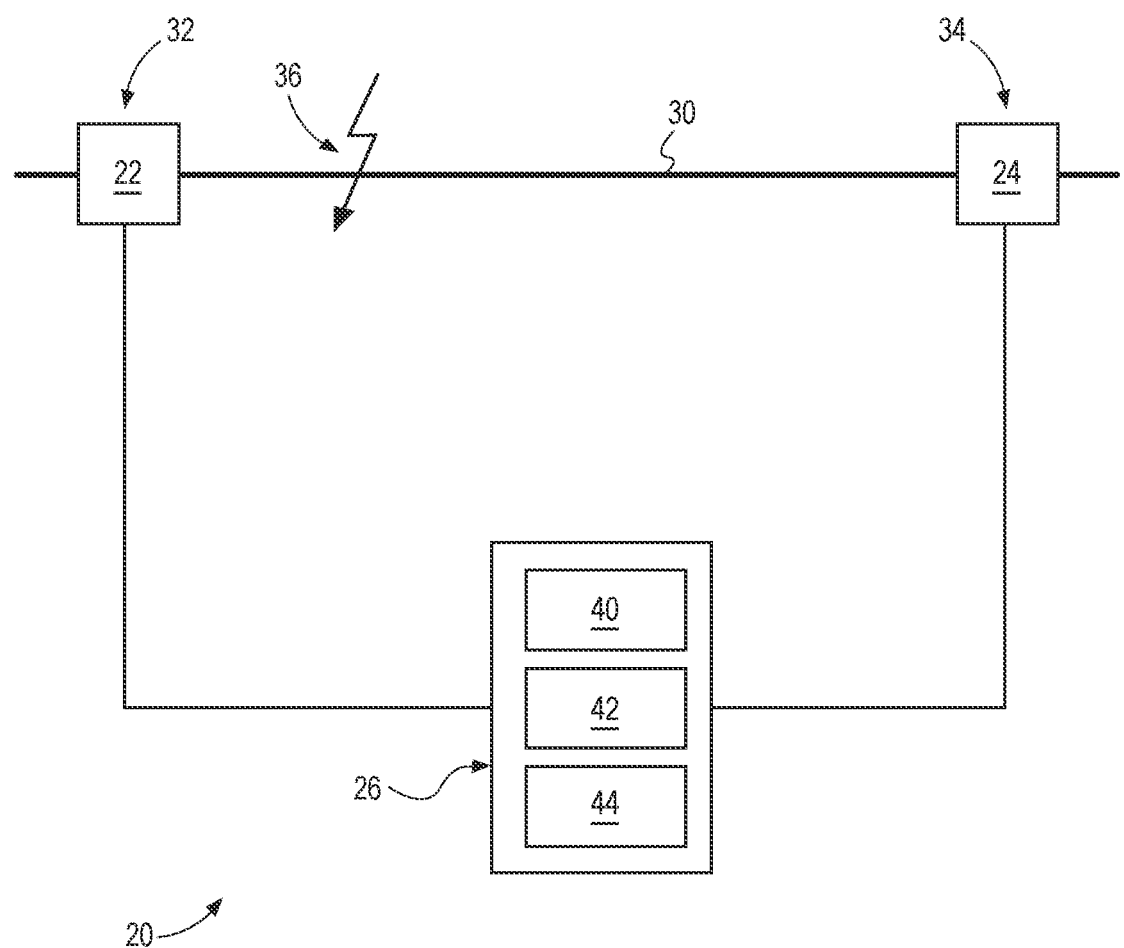
FIG. 2 shows a simplified schematic diagram of a system for analyzing traveling wave data and for determining a fault location in an electric power delivery system consistent with embodiments of the present disclosure.

FIG. 2 shows a simplified schematic diagram of a system 20 for analyzing TW data and for determining a fault location in an electric power delivery system, according to an embodiment of the present disclosure. The system 20 may include a first data acquisition subsystem 22, a second data acquisition subsystem 24, and a traveling wave analysis subsystem 26. The first data acquisition subsystem 22 may be located and configured to receive at least one of a measured voltage and a measured current of a power transmission line 30 at a first location 32 (e.g., a local terminal), and the second data acquisition subsystem 24 may be located and configured to receive at least one of a measured voltage and a measured current of the power transmission line 30 at a second location 34 (e.g., a remote terminal). The voltage and/or current measurements of the power transmission line 30 by the first data acquisition subsystem 22 and the second data acquisition subsystem 24 may include TW data, such as TWs originating from a fault location 36.

The traveling wave analysis subsystem 26 is configured to receive and analyze measured TW data from the first data acquisition subsystem 22 and the second data acquisition subsystem 24. The traveling wave analysis subsystem 26 may compensate for a time skew between actual TW arrival times and measured TW arrival times from the first data acquisition subsystem 22 and the second data acquisition subsystem 24 and determine a fault location 36 on the power transmission line 30 between the first location 32 and the second location 34.

To facilitate the TW analysis, the traveling wave analysis subsystem 26 may include a graphic user interface 40 configured to display a Bewley lattice diagram including TW data received from each of the first data acquisition subsystem 22 and the second data acquisition subsystem 24. The traveling wave analysis subsystem 26 may additionally include a processor 42 and a computer-readable storage medium 44.

The processor 42 may be configured to process data received from the first data acquisition subsystem 22 and the second data acquisition subsystem 24. The processor 42 may operate using any number of processing rates and architectures, and may be configured to perform various algorithms and calculations described herein. The processor 42 may be embodied as a general-purpose integrated circuit, an application specific integrated circuit, a field-programmable gate array, and/or any other suitable programmable logic device.

The computer-readable storage medium 44 may be the repository of a database containing properties for the power transmission line 30 and/or each section of the power transmission line 30, such as impedances, resistances, propagation times, reactances, lengths, and/or the like. The computer-readable storage medium 44 may also be the repository of various software modules configured to perform any of the methods described herein. Computer-readable storage medium 44 may comprise volatile storage (e.g., random access memory) and non-volatile storage.

Figure 3:
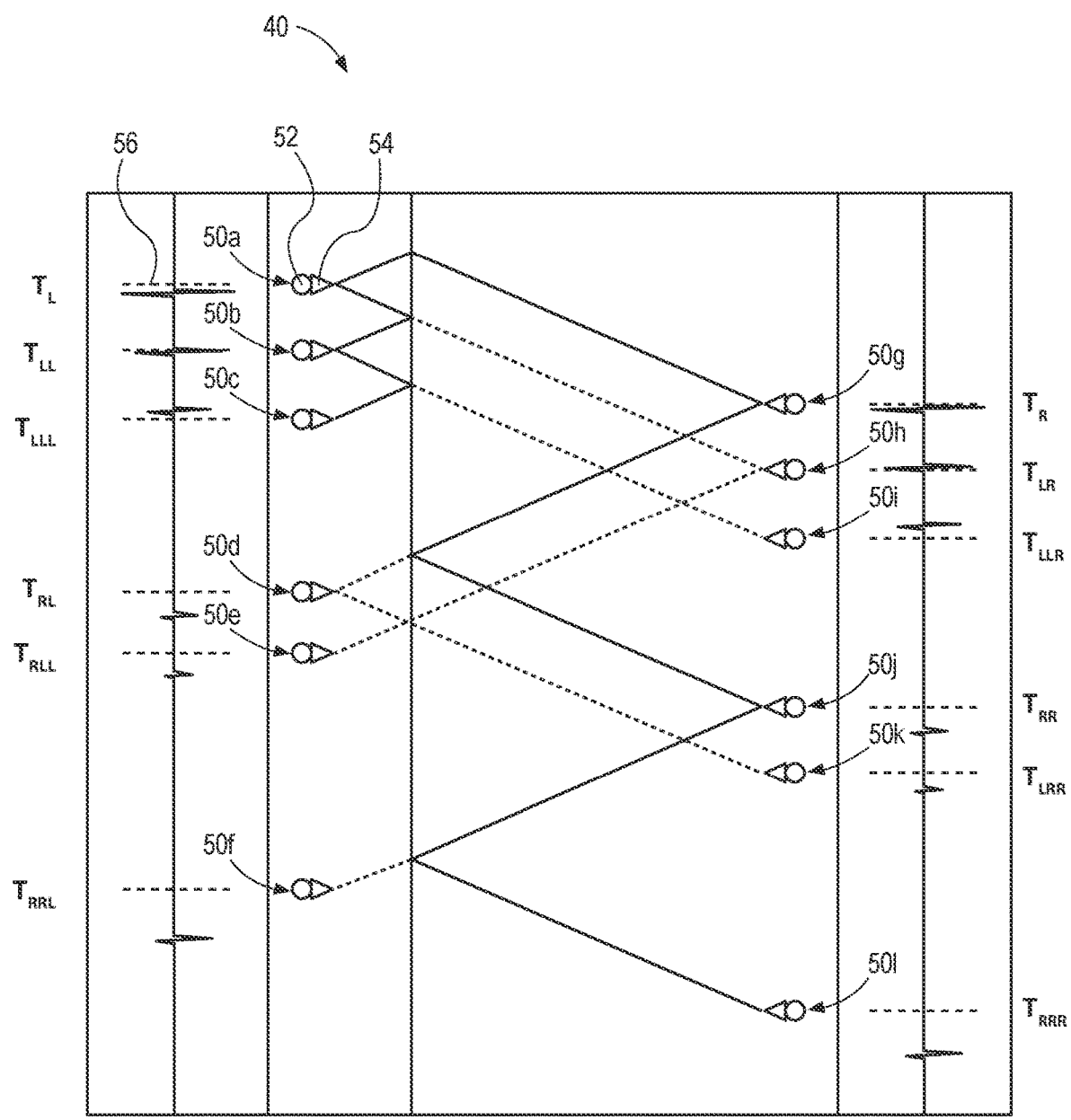
FIG. 3 shows a graphic user interface of the traveling wave analysis subsystem of FIG. 2 with a cursor shown located at each traveling wave arrival time on a Bewley lattice diagram, consistent with embodiments of the present disclosure.

FIG. 3 shows a graphic user interface of the traveling wave analysis subsystem of FIG. 2, and shows a cursor located at each TW arrival time on a Bewley lattice diagram, consistent with embodiments of the present disclosure. A cursor 50a-50l is shown located at each TW arrival time on the lattice. The time-aligned TW data is plotted next to each side of the lattice after passing through sufficient signal processing steps to make the TW arrival pulses visible. The signal processing may include any or all of transformation, low frequency removal, smoothing, differentiation, edge detection, matched filter squaring, and absolute value. For example, some transformations, such as conversion from ABC phases to Clarke components, may take advantage of cross coupling between phases. Further, once a TW has been identified, the first arrival (which tends to be of the largest magnitude) may be captured and applied as a matched filter to the entire signal at that terminal. In another example, once the signals are sufficiently processed, an interpolation algorithm may be applied to provide additional precision beyond the raw sample rate of a TW recorder. One method of interpolation is to apply a least-squared-error polynomial (e.g., parabolic for a second-order polynomial) fit to a range of points surrounding a TW arrival peak and assigning the timestamp of the TW arrival time to be the peak (or trough for signals in the negative direction) of the polynomial function.

The TW arrival times may be skewed (time delayed) by different amounts because different filters may be applied at each of the first data acquisition subsystem and the second data acquisition subsystem, and each filter may have a different delaying effect on the peak times. A traveling wave analysis subsystem can compensate via adjustments to the d parameter to account for this delay.

Referring again to FIG. 3, each cursor 50a-50l may consist of three parts. First, a circular handle 52 may allow the operator to move a cursor 50a-50l up (e.g., earlier in time) or down (e.g., later in time). Second, a triangular pin 54 may allow the operator to indicate that this is a fixed time value and movement of other cursors will not affect it. Note that a pinned cursor itself may still be moved. Pinning prevents the cursor from being indirectly moved due to the manipulation of other cursors. Third, a line, such as a dashed line 56, that may move with a cursor 50a-50l and may be overlaid on the TW plot may aid in aligning a cursor 50a-50l to a TW arrival time.

An operator may select any cursor 50a-50l to move. Since any row of the [A] matrix is of rank 1, moving a cursor 50a-50l, with no other cursors pinned, has the effect of shifting the entire lattice up/down. Once a cursor 50a-50l is aligned with a TW arrival time, it can be pinned.

Pinning a cursor may modify the ability to pin and/or manipulate other cursors 50a-50l. For any other cursor 50a-50l, if the two rows of the [A] matrix corresponding to a pinned cursor 50a-50l and a cursor 50a-50l of interest are examined, an additional cursor 50a-50l may be visible if the left two columns form a rank 2 matrix. If the resulting 2×2 matrix is of rank 1, certain cursors 50a-50l may not be displayed and may not be selectable.

In an additional embodiment, cursor 50a-50l visibility may be determined when one cursor 50a-50l is pinned by checking the rank of the first two columns (for manipulating the fault location, mT) or by forming the 2×2 matrix from the first and third column (for manipulating the propagation time, T). In this embodiment, the cursors 50a-50l that manipulate T may be modified to distinguish them (e.g., shape, color, label) from the cursors 50a-50l that manipulate mT.

Figure 4:
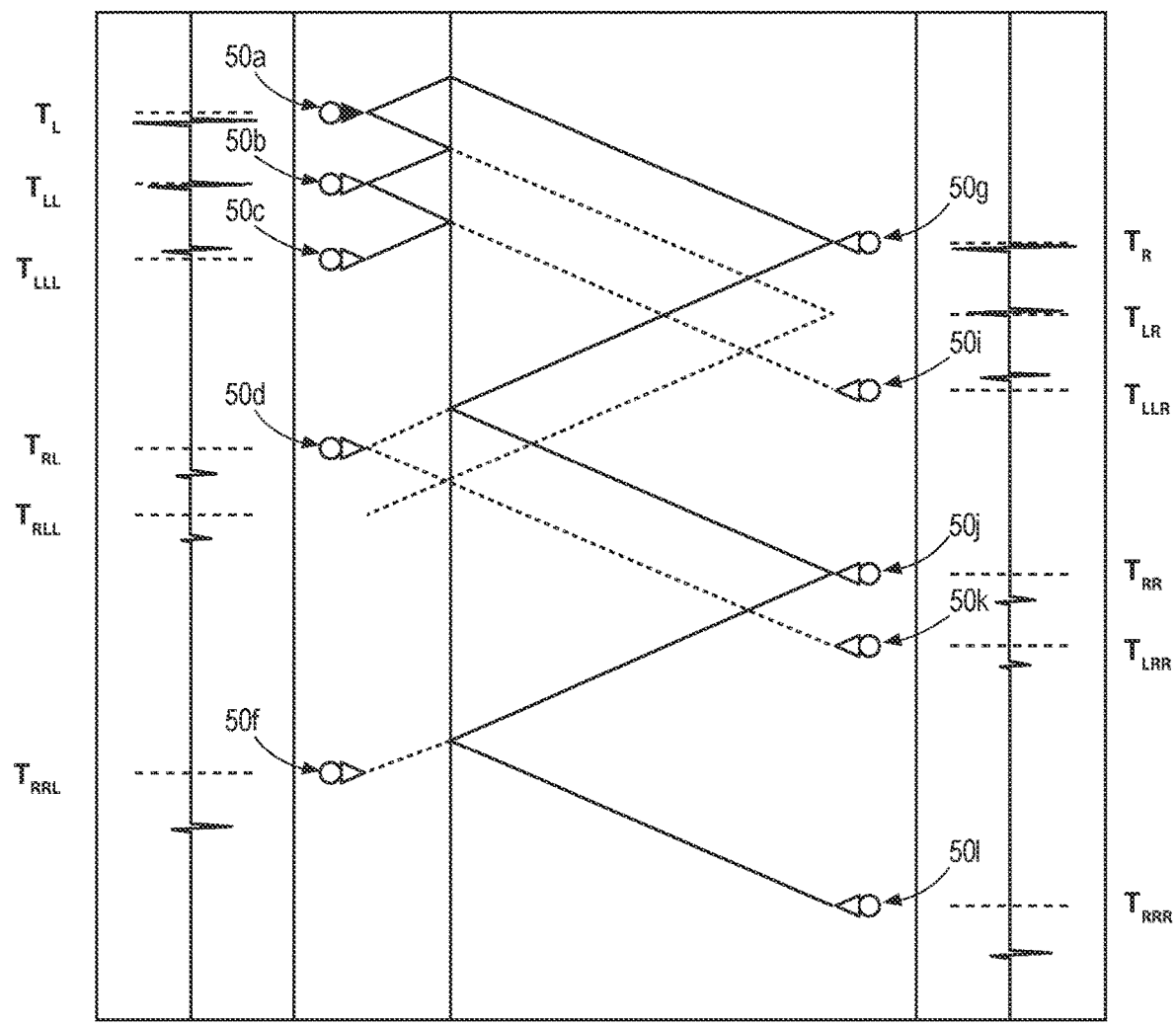
FIG. 4 shows the graphic user interface of FIG. 3 with a cursor corresponding to a traveling wave arrival time $T_L$ pinned.

As shown in FIG. 4, cursor 50a (corresponding to TW arrival time $T_L$) may be aligned and pinned. The pinning of cursor 50a is indicated by the triangle cursor being solid. Pinning cursor 50a may cause subsequent reflections (i.e., cursors 50h, 50e corresponding to TW arrival times $T_{LR}$ and $T_{RLL}$) to be hidden.

At this point, manipulating the cursor 50a ($T_L$) may still have the effect of shifting the lattice up or down as there is only a single cursor of interest. If one of the other visible cursors 50b, 50c, 50d, 50f, 50g, 50i-50l is manipulated, and thus including the row corresponding to that cursor in the equation, a rank 2 matrix may be formed, thus any manipulation results in modification to both $T_0$ and mT (the fault location).

Figure 5:
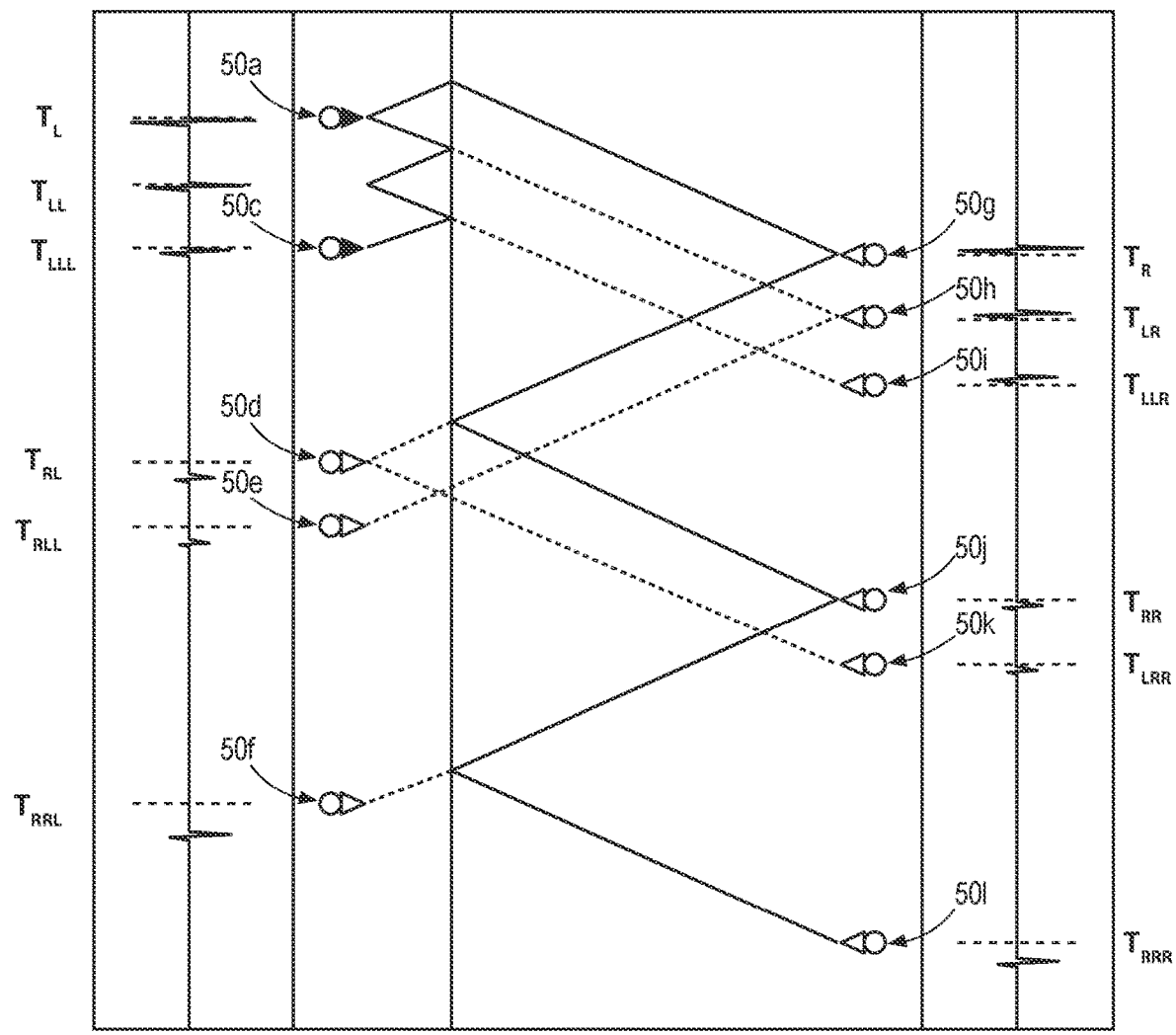
FIG. 5 shows the graphic user interface of FIG. 3 with cursors corresponding to traveling wave arrival times $T_L$ and $T_{LLL}$ pinned.

As shown in FIG. 5, cursor 50a and cursor 50c (corresponding to TW arrival times $T_L$ and $T_{LLL}$, respectively) may be pinned. Again, the triangle cursors of 50a and 50c are solid. Cursor 50b (corresponding to TW arrival time $T_{LL}$) may be hidden, as its row of the [A] matrix is linearly dependent on $T_L$ and $T_{LLL}$.

At this point, manipulating cursor 50a and cursor 50c may still have the effect of modifying $T_0$ and mT as the rank 2 matrix is maintained. If one of the other visible cursors 50d-50l is manipulated, a rank 3 matrix may be formed, thus any manipulation may result in modification to $T_0$, mT, and T (the TW propagation time).

Figure 6:
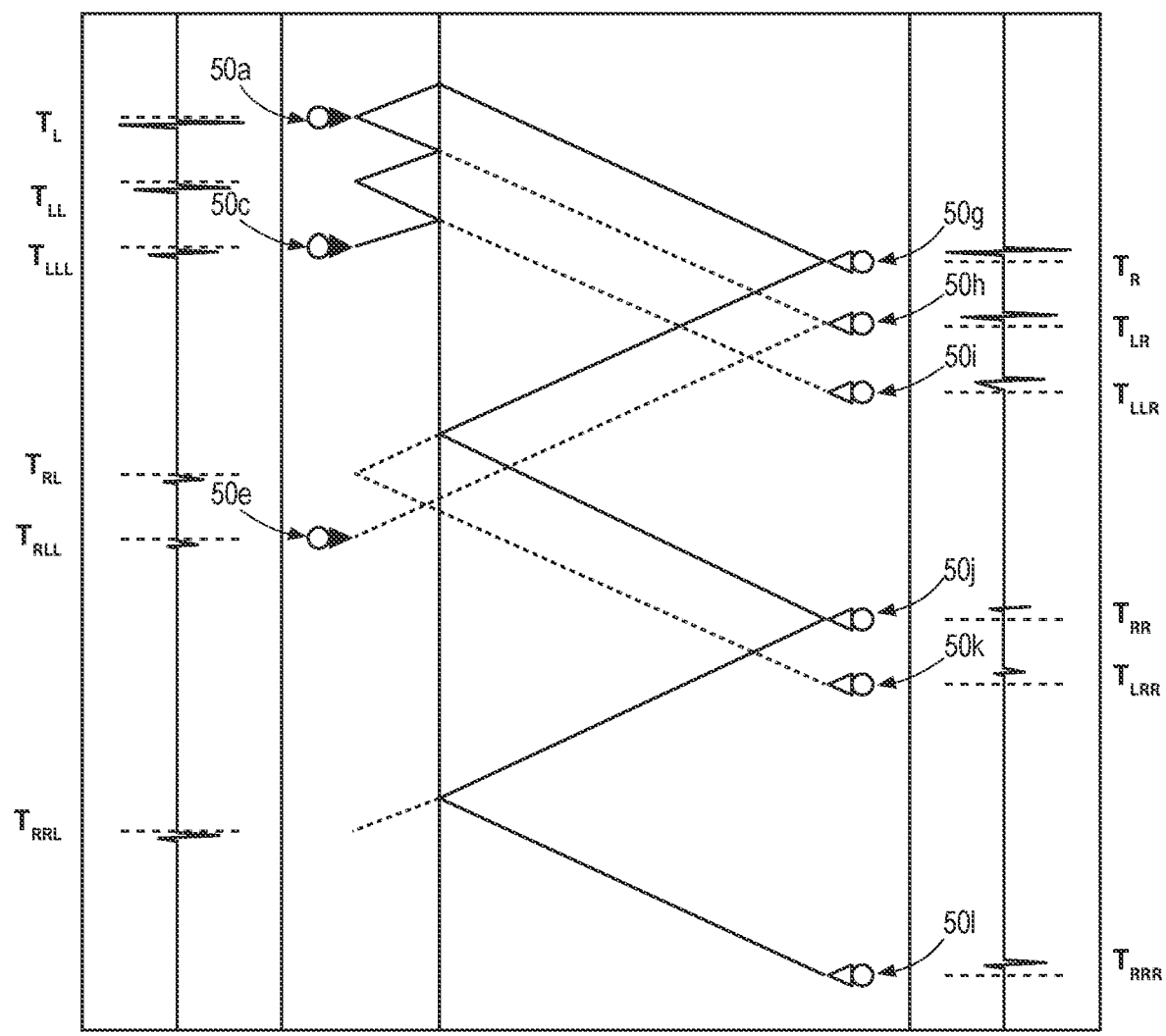
FIG. 6 shows the graphic user interface of FIG. 3 with cursors corresponding to traveling wave arrival times $T_L$, $T_{LLL}$, and $T_{RLL}$ pinned.

As shown in FIG. 6, cursor 50a, cursor 50c, and cursor 50e (corresponding to $T_L$, $T_{LLL}$, and $T_{RLL}$, respectively) may be pinned. Cursors 50b, 50d, and 50f may be hidden, as their rows of the [A] matrix are linearly dependent on the pinned cursors 50a, 50c, and 50e. Manipulating any of the pinned cursors 50a, 50c, and/or 50e may similarly modify the values of $T_0$, mT, and T.

If one of the visible non-pinned cursors 50g-50l are manipulated, their combined rows of the [A] matrix may form a rank 4 matrix, allowing the manipulation of d in addition to $T_0$, mT, and T.

Figure 7:
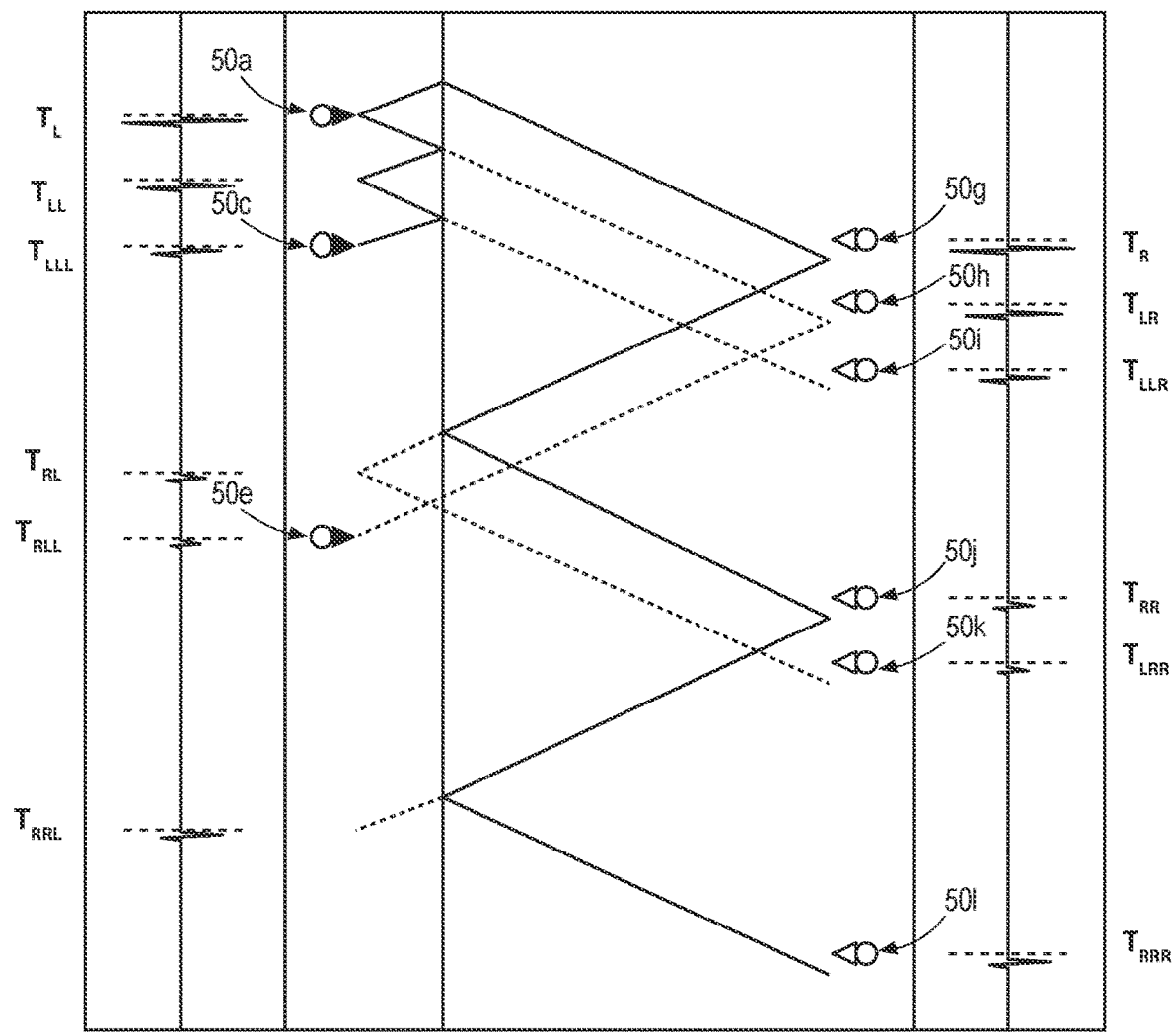
FIG. 7 shows the graphic user interface of FIG. 6 with a time offset between the cursor locations and corresponding reflections on the Bewley lattice diagram.

As shown in FIG. 7, a nonzero value for d may be shown as an offset (or as an arrow) between the cursor 50g-50l locations and the corresponding TW arrival times ($T_R$, $T_{LR}$, $T_{LLR}$, $T_{RR}$, $T_{LRR}$, and $T_{RRR}$) on the Bewley lattice diagram.

Figure 8:
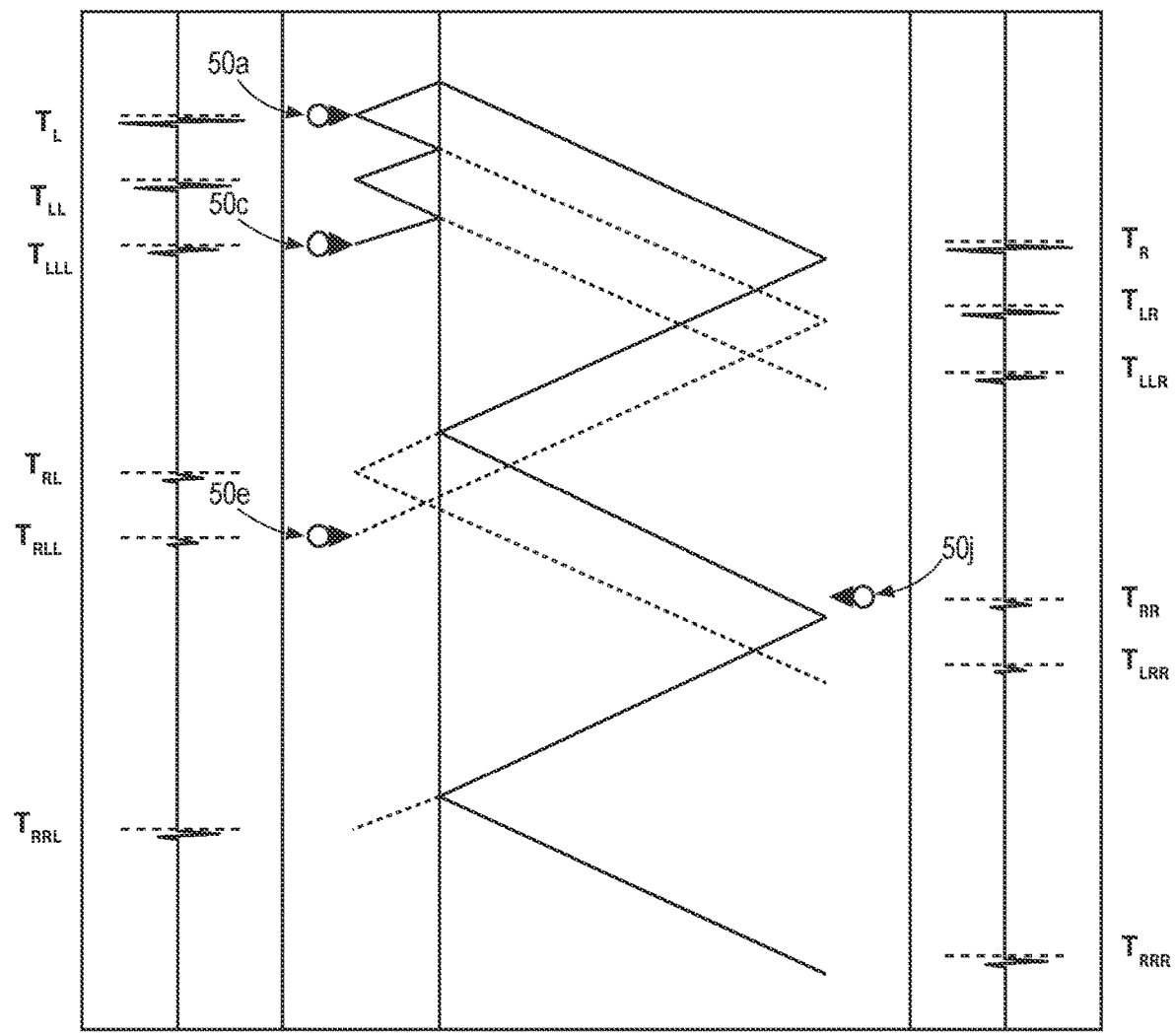
FIG. 8 shows the graphic user interface of FIG. 7 with a fourth cursor pinned, resulting in the hiding of all additional cursors.

If a fourth cursor 50j is pinned, as shown in FIG. 8, all remaining cursors 50b, 50d, 50f-50i, 50k, 50l may be hidden as a full rank (rank 4) for the system may be reached. Any manipulation of a fifth cursor would be redundant on this fully determined system of equations.

As described above with reference to FIGS. 3-8, the degrees of freedom available for manipulation may be based on the number of cursors 50a-50l that are pinned. An additional implementation provides another method to select which degrees of freedom are available by pinning mT, T, $T_0$, and/or d, as discussed below.

Since all of the columns are linearly independent, holding them constant may be accomplished by extracting columns of the [A] matrix as follows.

$$\begin{bmatrix} T_L \\ T_{LL} \\ T_{LR} \\ T_R \\ T_{RR} \\ T_{RL} \end{bmatrix} = \begin{bmatrix} 1 & 1 & 0 & 0 \\ 1 & 3 & 0 & 0 \\ 1 & 1 & 1 & 1 \\ 1 & -1 & 1 & 1 \\ 1 & -3 & 3 & 1 \\ 1 & -1 & 2 & 0 \end{bmatrix} \begin{bmatrix} T_0 \\ mT \\ T \\ d \end{bmatrix}$$

To hold $T_0$ constant, the $T_0$ column may be extracted.

$$\begin{bmatrix} T_L \\ T_{LL} \\ T_{LR} \\ T_R \\ T_{RR} \\ T_{RL} \end{bmatrix} = \begin{bmatrix} 1 & 0 & 0 \\ 3 & 0 & 0 \\ 1 & 1 & 1 \\ -1 & 1 & 1 \\ -3 & 3 & 1 \\ -1 & 2 & 0 \end{bmatrix} \begin{bmatrix} mT \\ T \\ d \end{bmatrix} + \begin{bmatrix} 1 \\ 1 \\ 1 \\ 1 \\ 1 \\ 1 \end{bmatrix} T_0$$

And the resulting equation may be solved.

$$\begin{bmatrix} T_L \\ T_{LL} \\ T_{LR} \\ T_R \\ T_{RR} \\ T_{RL} \end{bmatrix} - \begin{bmatrix} 1 \\ 1 \\ 1 \\ 1 \\ 1 \\ 1 \end{bmatrix} T_0 = \begin{bmatrix} 1 & 0 & 0 \\ 3 & 0 & 0 \\ 1 & 1 & 1 \\ -1 & 1 & 1 \\ -3 & 3 & 1 \\ -1 & 2 & 0 \end{bmatrix} \begin{bmatrix} mT \\ T \\ d \end{bmatrix}$$

This may be especially useful when an operator has confidence in a value for T, but not in d. By holding T constant, the cursors 50a-50l can be manipulated to adjust $T_0$, mT, and d.

An additional method is to swap the third and fourth columns of A and T and d in the right-hand vector. This results in modification to d when two cursors are pinned and a third cursor is moved. Then, pinning the third cursor and moving a fourth cursor may modify T as desired. The modified matrix equation is shown below.

$$\begin{bmatrix} T_L \\ T_{LL} \\ T_{LR} \\ T_R \\ T_{RR} \\ T_{RL} \end{bmatrix} = \begin{bmatrix} 1 & 1 & 0 & 0 \\ 1 & 3 & 0 & 0 \\ 1 & 1 & 0 & 1 \\ 1 & -1 & 1 & 1 \\ 1 & -3 & 3 & 3 \\ 1 & -1 & 1 & 2 \end{bmatrix} \begin{bmatrix} T_0 \\ mT \\ d \\ T \end{bmatrix}$$

Note that modification of the columns of the [A] matrix and associated vector of $T_0$, mT, d, and T while applying the standard algorithm described above allows the order of variable manipulation to be set arbitrarily.

If the fault location, m, is known, an operator may want to hold m constant instead of mT. Since mT and T both include T, it may be desirable to isolate m from mT. To do this the [A] matrix may be modified to include a fixed m value. To perform the modification, one may begin with the original equations:

$$\begin{bmatrix} T_L \\ T_{LL} \\ T_{LR} \\ T_R \\ T_{RR} \\ T_{RL} \end{bmatrix} = \begin{bmatrix} 1 & 1 & 0 & 0 \\ 1 & 3 & 0 & 0 \\ 1 & 1 & 1 & 0 \\ 1 & -1 & 1 & 1 \\ 1 & -3 & 3 & 1 \\ 1 & -1 & 2 & 1 \end{bmatrix} \begin{bmatrix} T_0 \\ mT \\ T \\ d \end{bmatrix}$$

Then m may be moved into the [A] matrix.

$$\begin{bmatrix} T_L \\ T_{LL} \\ T_{LR} \\ T_R \\ T_{RR} \\ T_{RL} \end{bmatrix} = \begin{bmatrix} 1 & m & 0 & 0 \\ 1 & 3m & 0 & 0 \\ 1 & m & 1 & 1 \\ 1 & -m & 1 & 1 \\ 1 & -3m & 3 & 1 \\ 1 & -m & 2 & 0 \end{bmatrix} \begin{bmatrix} T_0 \\ T \\ T \\ d \end{bmatrix}$$

Next, the second and third columns may be consolidated, and the resulting equation may be solved.

$$\begin{bmatrix} T_L \\ T_{LL} \\ T_{LR} \\ T_R \\ T_{RR} \\ T_{RL} \end{bmatrix} = \begin{bmatrix} 1 & m & 0 \\ 1 & 3m & 0 \\ 1 & 1+m & 1 \\ 1 & 1-m & 1 \\ 1 & 3-3m & 1 \\ 1 & 2-m & 0 \end{bmatrix} \begin{bmatrix} T_0 \\ T \\ d \end{bmatrix}$$

Because of the interdependence of T and mT, a similar procedure may be used to solve for $T_0$, m, and d while holding T constant.

Up to four TW arrival times may be assigned cursors to provide an exact match between the Bewley Lattice and the recorded TW signals. A best-fit result is also possible if, instead of providing a direct solution to the Bewley Lattice equations, a Moore-Penrose pseudo-inverse is applied to the constructed [A] matrix. The pseudo-inverse may provide a best-fit solution in the least-squared-error sense to a system of linear equations. Thus, more than four cursors can be pinned to provide an approximate solution.

Furthermore, a weighted-pseudo-inverse also exists by which different rows of the [A] matrix may have a stronger influence on the result than others. In some embodiments, this may be applied by assigning a weight to a TW arrival time proportional to the absolute magnitude of the TW arrival pulse for that row of the [A] matrix. In some embodiments, the weight can be manually assigned.

Other best-fit solutions may also be applied. For example, a minimum-squared-error method uses a 2-norm to minimize cost function. Other weights may equally be applied such as 1-norm of the absolute value, 4-norm, etc.

In view of the foregoing, methods of analyzing TW data resulting from a fault on an electric power delivery system according to embodiments of the present disclosure may comprise measuring electrical properties of a first TW on a power transmission line at a first location, measuring electrical properties of a second TW on the power transmission line at a second location, and analyzing the measured electrical properties of the first TW and the second TW to simultaneously determine the value of four parameters related to the first TW and the second TW.

The four parameters may be selected from a time (To) of a TW initiation at a fault location, a length of time (T) for a TW to traverse the entire line length, a time (mT) for the first TW arrival at the first location, a time skew (d) between the actual relative measured arrival times and the actual arrival times at the first location and the second location, and a location (m) of the initiation of the first TW. The value of any of the four parameters may be fixed and any of the four parameters that are not fixed may be calculated.

Optionally, signal processing, such as transformation, low frequency removal, smoothing, differentiation, edge detection, matched filter, squaring, and/or absolute value, may be performed on the measured electrical properties of the first TW and the second TW, and a time skew caused by signal processing between measured TW arrival times and actual TW arrival times at the first location and the second location may be compensated for.

To facilitate the analysis, a plurality of cursors may be arranged on a Bewley lattice diagram of a graphic user interface. An operator may pin up to four of the cursors to fix one or more of the four parameters. Additionally, a time skew (d) between the relative measured arrival times and the actual arrival times of the TWs at the first location and the second location may be displayed as an offset, arrow, or other offset indicator between the cursor locations and corresponding reflections on the Bewley lattice diagram.

Figure 9:
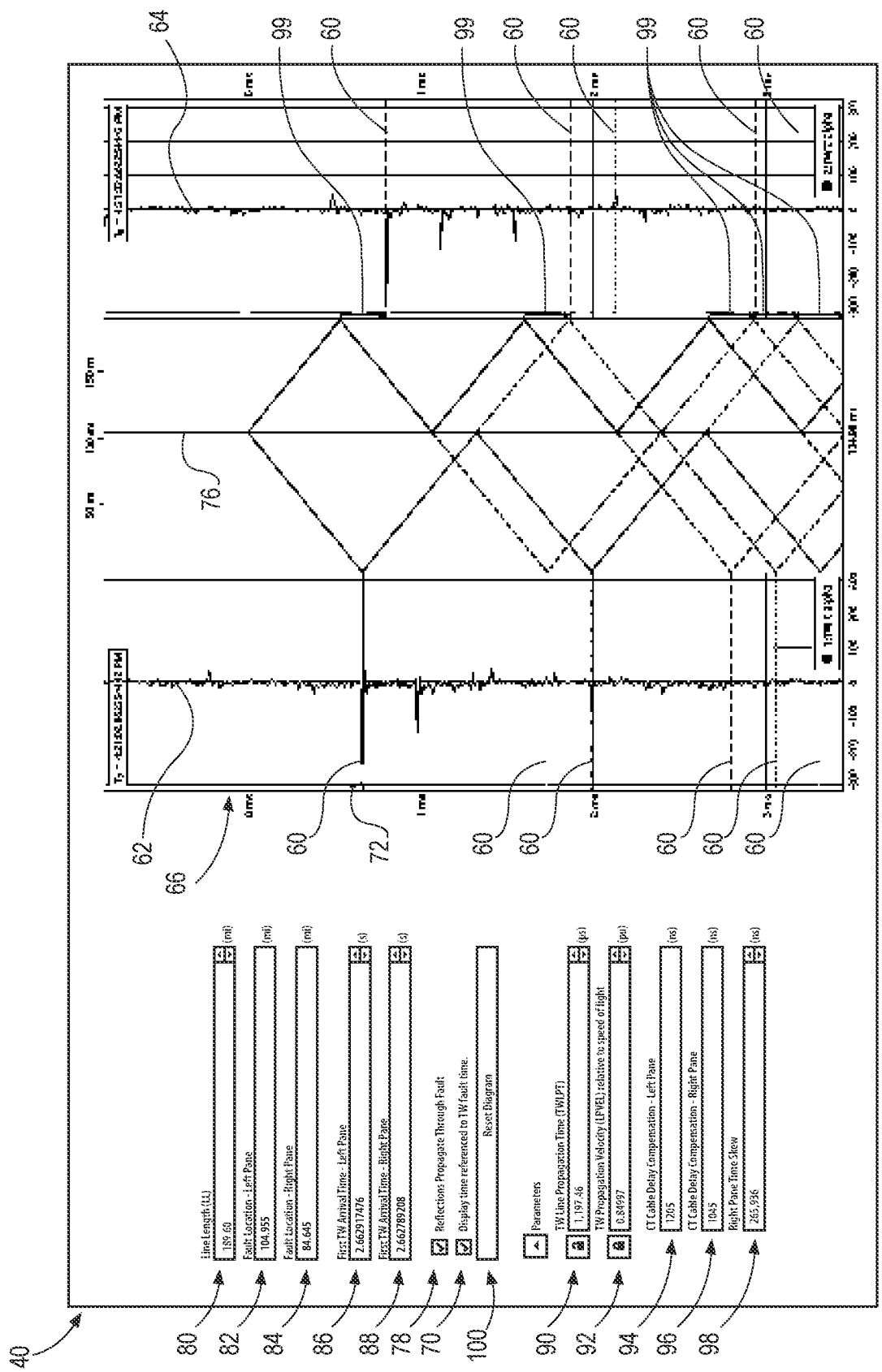
FIG. 9 shows an additional embodiment of the graphic user interface of a traveling wave analysis subsystem including an additional embodiment of a Bewley lattice diagram and additional parameter displays and inputs consistent with embodiments of the present disclosure.

FIG. 9 shows an additional embodiment of the graphic user interface 40 of a traveling wave analysis subsystem including an additional embodiment of a Bewley lattice diagram and additional parameter displays and inputs consistent with embodiments of the present disclosure. In this embodiment a line, which may be a solid and/or dashed line, associated with each TW reflection may function as a cursor 60 (e.g., a handle) that may be utilized by a user to move the location of the line and the associated TW reflection on the Bewley lattice diagram.

As shown, each cursor 60 may be positioned overlying a graphical representation of a respective measured traveling wave signal 62, 64 on a timescale 66. Each timescale 66 may include the time $T_0$ located near the top of the timescale 66 with time progressing forward in a downward direction. In some embodiments the diagram may be drawn vertically as shown, with time progressing from top to bottom. In additional embodiments, the diagram may be drawn horizontally with time progressing from left to right. The graphic user interface 40 may include an input 70 to allow an operator to select the time to be displayed relative to the TW fault time ($T_0$), as shown in FIG. 9, or to be displayed using the time recorded by the data acquisition subsystem. Once a cursor 60 and the associated TW reflection on the Bewley lattice diagram is placed in a desired location, an operator may pin a cursor 60, which may be indicated by a symbol 72 (e.g., a symbol of a thumbtack).

Additionally, an operator may choose to display reflections propagated through a fault 76 (as indicated by the lines in FIG. 9) or choose to have them hidden by selecting the input 78.

In addition to manipulating parameters with the cursors 60 on the Bewley lattice diagram, an operator may manipulate parameters in the fields provided on the left-hand side of the graphic user interface 40. A line length field 80 may import a value for a line length (LL) from a database where a known line length is stored and/or a value for the line length may be input directly or changed by an operator or calculated from other system parameters.

A fault location may be displayed in a left pane fault location field 82 and a right pane fault location field 84, each indicating a respective distance between the fault location and end of the line. These values may be calculated and displayed based on other measured and entered parameters. These fault location values may additionally be entered by an operator, should the operator know the fault location and/or desire to examine other parameters related to the measured traveling wave signals 62, 64, such as to evaluate potential delays or discrepancies in the system.

Likewise, first TW arrival times may be displayed in a left pane first TW arrival time field 86 and a right pane first TW arrival time field 88. These TW arrival times may be determined by positioning the cursors 60 on the Bewley lattice diagram and/or by entering a time directly into the left pane first TW arrival time field 86 and/or the right pane first TW arrival time field 88.

Additional fields may also be provided that may include values that may be calculated, retrieved from a database, and/or entered by an operator, such as a TW line propagation time field 90, a TW propagation velocity field 92, a left pane CT cable delay compensation field 94, a right pane CT cable delay compensation field 96, and a time skew field, such as a right pane time skew field 98. Directly entering some values may affect other values (for example, how propagation time, propagation velocity, and line length are related by equation 1). A reset input 100 may also be provided to enable an operator to reset the Bewley lattice diagram to its prior and/or default state. These parameter fields are provided as non-limiting examples, and additional or fewer parameter fields may be provided according to various embodiments of the present disclosure.

A time skew 99 is shown on the right pane of the Bewley lattice diagram and in the right pane time skew field 98, indicating a time difference between peaks visible in the measured traveling wave signal 64 and the arrival of each TW according to the Bewley lattice diagram in the right pane. There may be many causes for such a time skew, such as a difference in the measured times between a local terminal and a remote terminal, CT or PT group delay, or clock synchronization error, for example. The system may allow the time skew to be removed by the operator, which may result in improved alignment between the measured TW signals 64 and the Bewley lattice diagram, as will be described further with reference to FIGS. 10 and 11.

Figure 10:
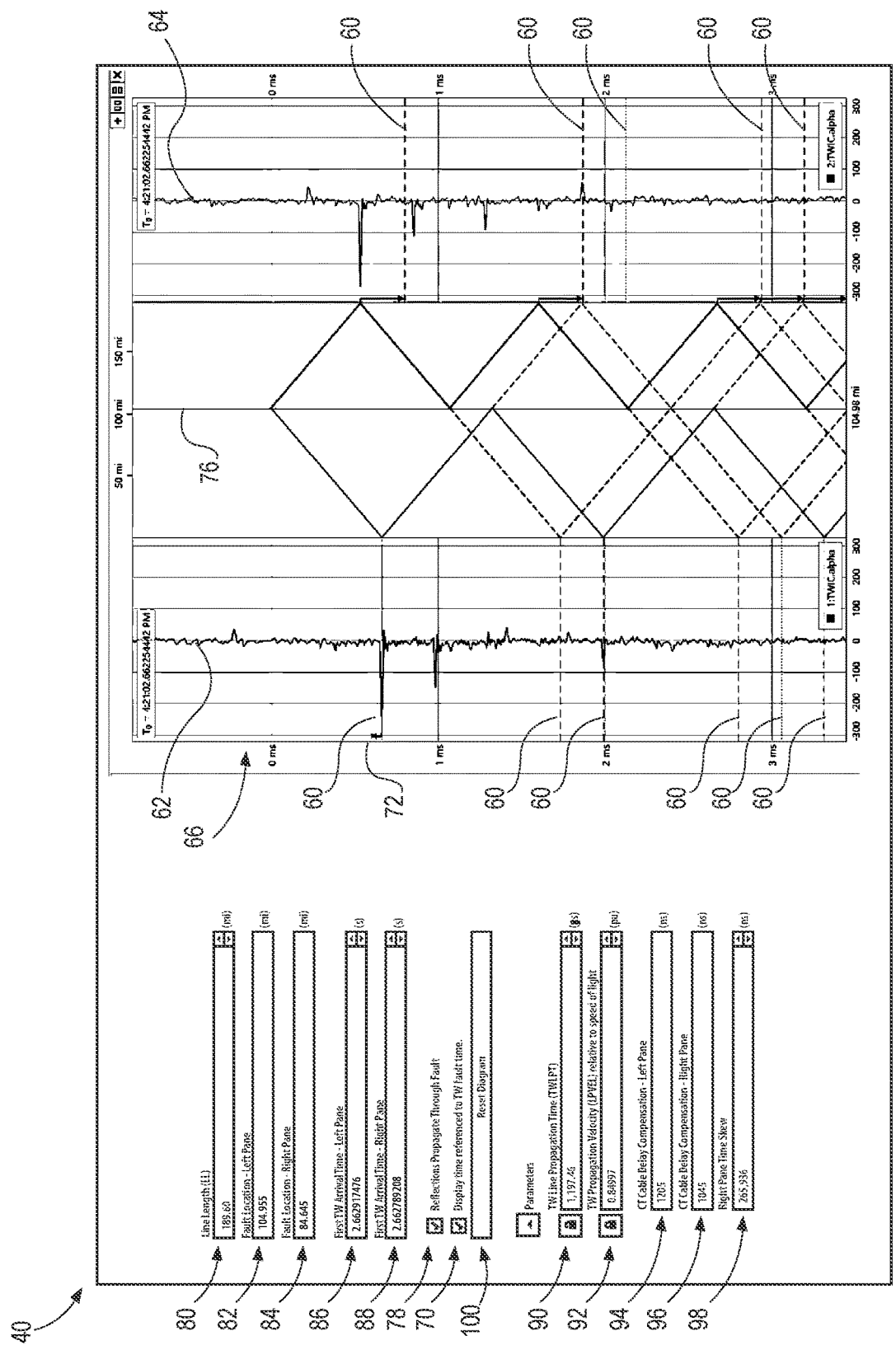
FIG. 10 shows the graphic user interface of FIG. 9 after a time shift has been applied to a traveling wave signal to compensate for a skew between recording devices.

FIG. 10 shows the graphic user interface 40 of FIG. 9 after a time shift has been applied to the measured traveling wave signal 64. As shown, an operator may shift the graph of the measured traveling wave signal 64 on the timescale 66 in the negative direction by an amount equal to the magnitude of the time skew. Thus, the arrival of TWs according to the Bewley lattice diagram in the right pane and the peaks visible in the measured traveling wave signal 64 may be better aligned on the Bewley lattice diagram.

Figure 11:
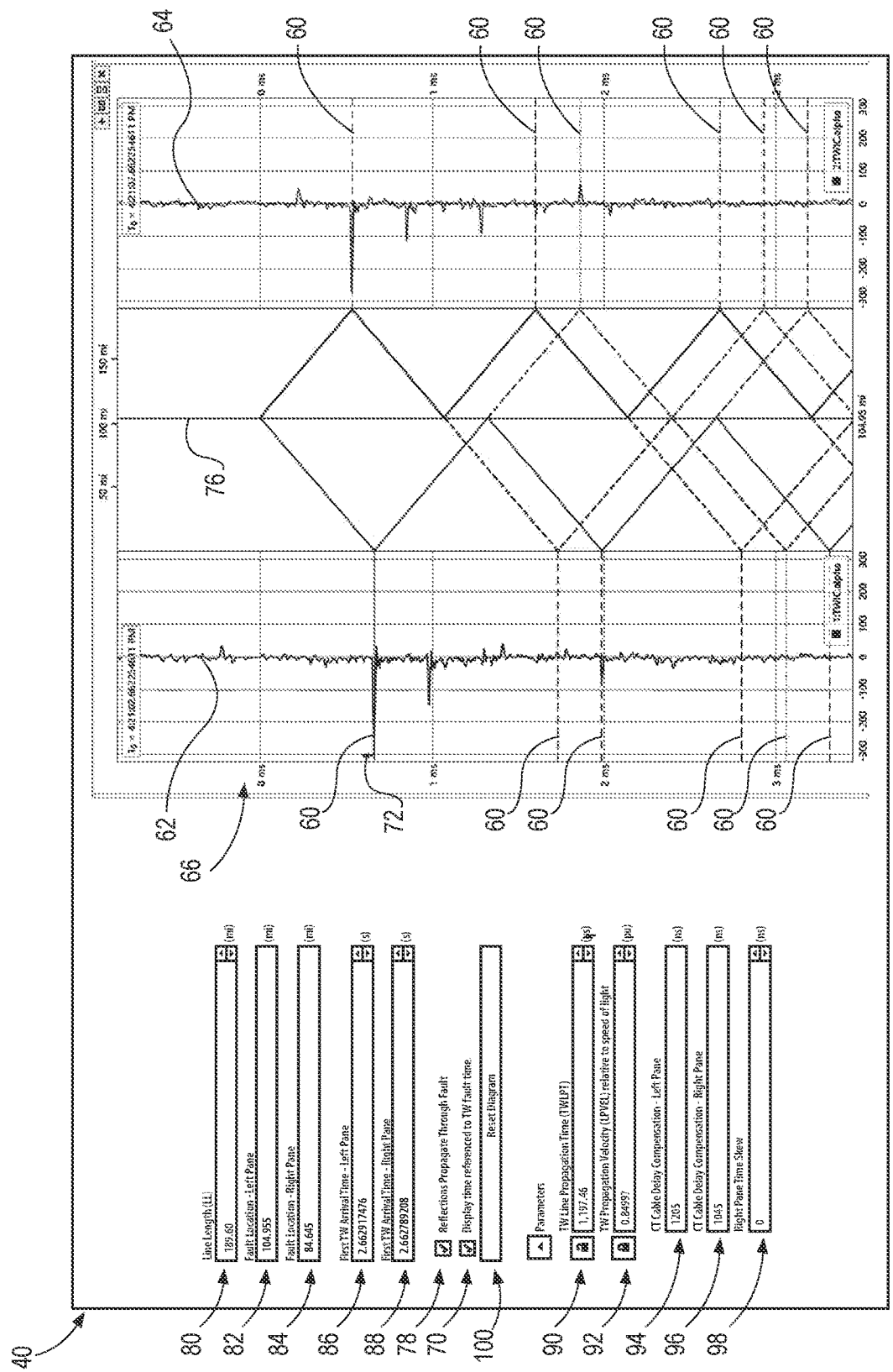
FIG. 11 shows the graphic user interface of FIG. 10 after a time skew has been removed to account for the time shift applied to the traveling wave signal.

FIG. 11 shows the graphic user interface of FIG. 10 after the time skew has been removed to account for the time shift applied to the measured traveling wave signal 64. Accordingly, the Bewley lattice diagram may be modified by an operator to shift the graph of a measured traveling wave signal on a timescale, such as to compensate for a time skew, for improved TW analysis, and for a clear and precise understanding of the Bewley lattice diagram.

While specific embodiments and applications of the disclosure have been illustrated and described, it is to be understood that the disclosure is not limited to the precise configurations and components disclosed herein. Accordingly, many changes may be made to the details of the above-described embodiments without departing from the underlying principles of this disclosure. The scope of the present invention should, therefore, be determined only by the following claims.

What is claimed is:

1. A system configured to determine a fault location in an electric power delivery system, comprising:
   a first data acquisition subsystem configured to generate a measurement corresponding to a traveling wave arrival and a first plurality of measurements corresponding to arrival times of the traveling wave at a local terminal;
   a second data acquisition subsystem configured to generate a measurement corresponding to the traveling wave and a second plurality of measurements corresponding to arrival times of the traveling wave at a remote terminal; and
   a traveling wave analysis subsystem configured to:
      analyze measured traveling wave data from the first data acquisition subsystem and the second data acquisition subsystem;
      receive user input to correlate at least one of the first plurality of measurements and the second plurality of measurements to a Bewley lattice diagram; and
      adjust a first parameter related to the fault based on the user input;
   wherein the first parameter comprises a time skew comprising a difference between a first clock signal at the local terminal and a second clock signal remote terminal.

2. The system of claim 1, wherein a second parameter comprises a time of initiation of the traveling wave.

3. The system of claim 1, wherein a second parameter comprises the TW traversal time from the fault to the local terminal.

4. The system of claim 1, wherein a second parameter comprises the TW traversal time from the local terminal to the remote terminal.

5. The system of claim 1, wherein the traveling wave analysis subsystem is configured to generate a representation of a traveling wave signal received at the local terminal and a traveling wave signal received at the remote terminal on the Bewley lattice diagram.

6. The system of claim 5, wherein the representation displays an indication of a time difference between an arrival time on the Bewley diagram and a peak identified in the traveling wave signal received at the remote terminal.

7. The system of claim 1, wherein the traveling wave analysis subsystem is further configured to receive user input comprising at least one of a line length and propagation velocity of the traveling wave.

8. A system configured to determine a fault location in an electric power delivery system, comprising:
   a first data acquisition subsystem configured to generate a measurement corresponding to a traveling wave arrival and a first plurality of measurements corresponding to arrival times of the traveling wave at a local terminal;
   a second data acquisition subsystem configured to generate a measurement corresponding to the traveling wave and a second plurality of measurements corresponding to arrival times of the traveling wave at a remote terminal; and
   a traveling wave analysis subsystem configured to:
      analyze measured traveling wave data from the first data acquisition subsystem and the second data acquisition subsystem;
      receive user input to correlate at least one of the first plurality of measurements and the second plurality of measurements to a Bewley lattice diagram; and
      adjust a parameter related to the fault based on the user input;
   wherein the traveling wave analysis subsystem is configured to generate a representation of a traveling wave signal received at the local terminal and a traveling wave signal received at the remote terminal on the Bewley lattice diagram; and
   wherein user input comprises adjustment of at least one cursor to align at least one peak of the measured traveling wave signal at the local terminal or the measured traveling wave signal at the remote terminal to traveling waves that arrive at the respective line terminal according to the Bewley lattice diagram.

9. A method of analyzing traveling wave data resulting from a fault on an electric power delivery system, comprising:
   generating a measurement corresponding to a traveling wave arrival and a first plurality of measurements corresponding to arrival times of the traveling wave at a local terminal;
   generating a measurement corresponding to the traveling wave and a second plurality of measurements corresponding to arrival times of the traveling wave at a remote terminal;
   analyzing the measured traveling wave data from a first data acquisition subsystem and a second data acquisition subsystem;
   receiving user input to correlate at least one of the first plurality of measurements and the second plurality of measurements to a Bewley lattice diagram; and
   adjusting a first parameter related to the fault based on the user input;
   wherein the first parameter comprises a time skew comprising a difference between a first clock signal at the local terminal and a second clock signal remote terminal.

10. The method of claim 9, further comprising adjusting a second parameter comprising a time of initiation of the traveling wave.

11. The method of claim 9, further comprising adjusting a second parameter comprising an arrival time at the local terminal.

12. The method of claim 9, further comprising adjusting a second parameter comprising an arrival time at the remote terminal.

13. The method of claim 9, further comprising adjusting a second parameter comprising a line propagation time.

14. The method of claim 9, further comprising adjusting a second parameter comprising a fault location.

15. The method of claim 9, further comprising generating a representation of a traveling wave signal received at the local terminal and a traveling wave signal received at the remote terminal on the Bewley lattice diagram.

16. The method of claim 15, wherein receiving user input comprises receiving at least one adjustment of at least one cursor to align at least one peak of the traveling wave signal received at the local terminal or the traveling wave signal received at the remote terminal to TWs that arrive at the respective terminal according to the Bewley lattice diagram.

17. The method of claim 15, wherein generating the representation further comprises displaying an indication of a time difference between an arrival time on the Bewley diagram and a peak identified in the traveling wave signal received at the remote terminal.

18. The method of claim 9, further comprising receiving user input comprising at least one of a line length and propagation velocity of the traveling wave.

* * * * *